US010622489B2

United States Patent
Yeung et al.

(10) Patent No.: US 10,622,489 B2
(45) Date of Patent: Apr. 14, 2020

(54) VERTICAL TUNNEL FET WITH SELF-ALIGNED HETEROJUNCTION

(71) Applicant: International Business Machines Corporation, Armonk, NY (US)

(72) Inventors: Chun Wing Yeung, Niskayuna, NY (US); Choonghyun Lee, Rensselaer, NY (US); Shogo Mochizuki, Clifton Park, NY (US); Ruqiang Bao, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/783,029

(22) Filed: Oct. 13, 2017

(65) Prior Publication Data

US 2019/0115479 A1    Apr. 18, 2019

(51) Int. Cl.
*H01L 29/808* (2006.01)
*H01L 29/22* (2006.01)
(Continued)

(52) U.S. Cl.
CPC ...... *H01L 29/8083* (2013.01); *H01L 29/0661* (2013.01); *H01L 29/0676* (2013.01); *H01L 29/0692* (2013.01); *H01L 29/0834* (2013.01); *H01L 29/1066* (2013.01); *H01L 29/1095* (2013.01); *H01L 29/165* (2013.01);
(Continued)

(58) Field of Classification Search
CPC .......... H01L 29/78; H01L 29/7391; H01L 29/66356; H01L 29/66037; H01L 29/42376; H01L 29/41783; H01L 29/22; H01L 29/1608; H01L 29/1095; H01L 29/1066; H01L 29/0676; H01L 29/8083; H01L 29/4966; H01L 29/423;
(Continued)

(56) References Cited

U.S. PATENT DOCUMENTS 8,362,560 B2    1/2013  Kulkarni et al.
8,685,788 B2    4/2014  Bao et al.
(Continued)

OTHER PUBLICATIONS

Datta, "Advanced FinFETs and Tunnel FETs for HPC", University of Notre Dame, HPC Workshop 2016, Baltimore (Year: 2016).*
(Continued)

*Primary Examiner* — Ismail A Muse
*Assistant Examiner* — Charles N Ausar-El
(74) *Attorney, Agent, or Firm* — Vazken Alexanian; Michael J. Chang, LLC

(57) ABSTRACT

Techniques for integrating a self-aligned heterojunction for TFETs in a vertical GAA architecture are provided. In one aspect, a method of forming a vertical TFET device includes: forming a doped SiGe layer on a Si substrate; forming fins that extend through the doped SiGe layer and partway into the Si substrate such that each of the fins includes a doped SiGe portion disposed on a Si portion with a heterojunction therebetween, wherein the SiGe portion is a source and the Si portion is a channel; selectively forming oxide spacers, aligned with the heterojunction, along opposite sidewalls of only the doped SiGe portion; and forming a gate stack around the Si portion and doped SiGe that is self-aligned with the heterojunction. A vertical TFET device formed by the method is also provided.

18 Claims, 13 Drawing Sheets

(51) Int. Cl.
  *H01L 29/66* (2006.01)
  *H01L 29/739* (2006.01)
  *H01L 29/06* (2006.01)
  *H01L 29/423* (2006.01)
  *H01L 29/10* (2006.01)
  *H01L 29/16* (2006.01)
  *H01L 29/78* (2006.01)
  *H01L 29/417* (2006.01)
  *H01L 29/165* (2006.01)
  *H01L 29/08* (2006.01)
  *H01L 29/49* (2006.01)
  *H01L 29/40* (2006.01)
  *H01L 29/161* (2006.01)

(52) U.S. Cl.
  CPC .......... *H01L 29/1608* (2013.01); *H01L 29/22* (2013.01); *H01L 29/401* (2013.01); *H01L 29/41783* (2013.01); *H01L 29/423* (2013.01); *H01L 29/42376* (2013.01); *H01L 29/4966* (2013.01); *H01L 29/66037* (2013.01); *H01L 29/66356* (2013.01); *H01L 29/7391* (2013.01); *H01L 29/78* (2013.01); *H01L 29/161* (2013.01)

(58) Field of Classification Search
  CPC . H01L 29/401; H01L 29/165; H01L 29/0834; H01L 29/0692; H01L 29/0661
  See application file for complete search history.

(56) References Cited

U.S. PATENT DOCUMENTS

| | | | |
|---|---|---|---|
| 9,087,772 B2 | 7/2015 | Lauer et al. | |
| 9,184,238 B2 | 11/2015 | Hisada et al. | |
| 9,202,812 B2 | 12/2015 | Cheng et al. | |
| 9,202,920 B1 | 12/2015 | Liu et al. | |
| 9,224,736 B1* | 12/2015 | Ching | H01L 27/0924 |
| 9,287,362 B1 | 3/2016 | Basu et al. | |
| 9,385,195 B1* | 7/2016 | Zhang | H01L 29/1033 |
| 9,412,603 B2* | 8/2016 | Zhang | H01L 21/30604 |
| 9,530,866 B1* | 12/2016 | Zhang | H01L 29/66666 |
| 9,595,449 B1* | 3/2017 | Jagannathan | H01L 21/3105 |
| 9,614,091 B2* | 4/2017 | Colinge | H01L 29/788 |
| 9,653,585 B2* | 5/2017 | Zhang | H01L 29/1033 |
| 9,748,382 B1* | 8/2017 | Gluschenkov | H01L 29/7827 |
| 9,773,875 B1* | 9/2017 | Jagannathan | H01L 29/165 |
| 9,799,751 B1* | 10/2017 | Zhang | H01L 29/66666 |
| 9,882,025 B1* | 1/2018 | Zhang | H01L 29/66666 |
| 9,954,101 B2* | 4/2018 | Bu | H01L 29/7827 |
| 2013/0032876 A1 | 2/2013 | Cheng et al. | |
| 2016/0141365 A1* | 5/2016 | Campi, Jr. | H01L 29/66712 257/329 |
| 2016/0197004 A1* | 7/2016 | Akarvardar | H01L 21/76202 257/509 |
| 2018/0138307 A1* | 5/2018 | Nowak | H01L 29/7391 |

OTHER PUBLICATIONS

King Liu, "FinFET: History, Fundamentals and Future" Department of Electrical Engineering and Computer Sciences, University of California, Berkeley, California 94720-1770; 2012 Symposium on VLSI Technology Short Course. (Year: 2012).*

Lapedus, "What's After FinFETs?", Semiconductor Engineering, pp. 1-32. (Year: 2017).*

R. Gandhi et al., "CMOS-Compatible Vertical-Silicon-Nanowire Gate-All-Around p-Type Tunneling FETs With ≤ 50-mV/decade Subthreshold Swing," IEEE Electron Device Letters, vol. 32, No. 11, Nov. 2011, pp. 1504-1506.

X-D. Wang et al., "Two-dimensional ultrashallow junction characterization of metal-oxide-semiconductor field effect transistors with strained silicon," Journal of Vacuum Science & Technology B, vol. 22, No. 1, Jan./Feb. 2004, pp. 373-376.

K.K. Bhuwalka et al., "A simulation approach to optimize the electrical parameters of a vertical tunnel FET," IEEE Transactions on Electron Devices, vol. 52, No. 7, Jul. 2005, pp. 1541-1547.

* cited by examiner

FIG. 1
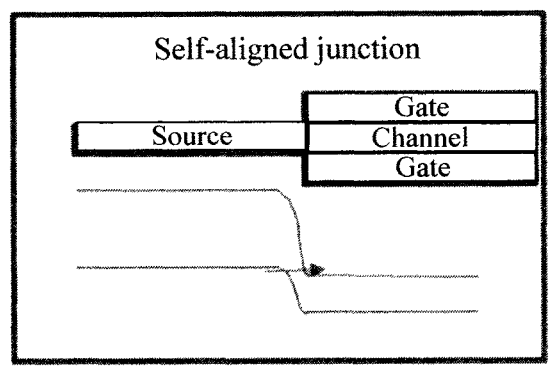
FIG. 2
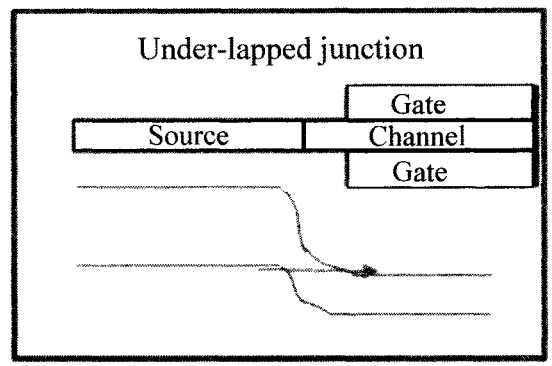
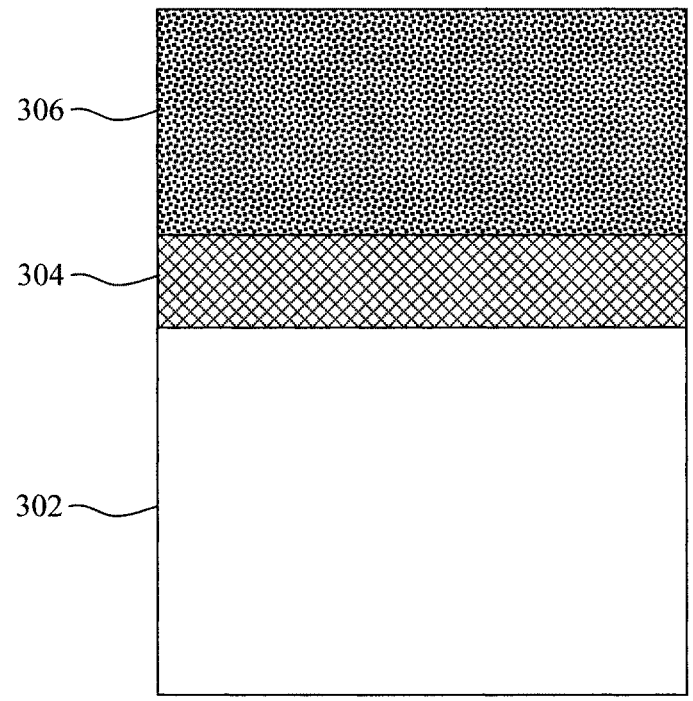
FIG. 3

VERTICAL TUNNEL FET WITH SELF-ALIGNED HETEROJUNCTION

FIELD OF THE INVENTION

The present invention relates to tunnel field effect transistors (TFETs), and more particularly, to VFET devices and techniques for integrating a self-aligned heterojunction for TFET in a vertical gate-all-around (GAA) architecture.

BACKGROUND OF THE INVENTION

Like a metal-oxide semiconductor field effect transistor (MOSFET) a tunnel FET (TFET) has a source connected to a drain by a channel. The source and drain of a TFET, however, have an opposite polarity from one another. TFETs function by modulating tunneling through a barrier. TFETs advantageously have the potential to enable ultra-low power electronics because the subthreshold swing can go below 60 mV/decade (which is a fundamental limit of MOSFETs).

There are two requirements for TFETs to operate. One is uniform control of source side junction electrostatic for abrupt turn-on, and the other is a source-side hetero-junction (source) to reduce the tunneling barrier for increased drive current. A vertical gate-all-around (GAA) device architecture can satisfy both of these requirements and therefore is an ideal configuration for TFETs.

Thus, techniques for implementing a TFET in a vertical GAA architecture would be desirable.

SUMMARY OF THE INVENTION

The present invention provides techniques for integrating a self-aligned heterojunction for tunnel field effect transistors (TFETs) in a vertical gate-all-around (GAA) architecture. In one aspect of the invention, a method of forming a vertical TFET device is provided. The method includes: forming a doped silicon germanium (SiGe) layer on a silicon (Si) substrate; forming fins that extend through the doped SiGe layer and partway into the Si substrate such that each of the fins includes a doped SiGe portion disposed on a Si portion with a heterojunction therebetween, wherein the SiGe portion is a source and the Si portion is a channel; forming a drain in the Si substrate beneath the fins; forming a bottom spacer on the drain; selectively forming oxide spacers, aligned with the heterojunction, along opposite sidewalls of only the doped SiGe portion of each of the fins; and forming a gate stack around the Si portion and doped SiGe portion of each of the fins, wherein the gate stack is offset from the source by the oxide spacers and thereby self-aligned with the heterojunction.

In another aspect of the invention, a vertical TFET device is provided. The vertical TFET device includes: fins formed on an Si substrate, wherein each of the fins includes a doped SiGe portion disposed on a Si portion with a heterojunction therebetween, wherein the SiGe portion is a source and the Si portion is a channel; a drain formed in the Si substrate beneath the fins; a bottom spacer on the drain; oxide spacers, aligned with the heterojunction, disposed along opposite sidewalls of only the doped SiGe portion of each of the fins; and a gate stack surrounding the Si portion and doped SiGe portion of each of the fins, wherein the gate stack is offset from the source by the oxide spacers and thereby self-aligned with the heterojunction.

A more complete understanding of the present invention, as well as further features and advantages of the present invention, will be obtained by reference to the following detailed description and drawings.

BRIEF DESCRIPTION OF THE DRAWINGS

FIG. 1 is a diagram illustrating a tunnel field effect transistor (TFET) architecture having a self-aligned junction according to an embodiment of the present invention;

FIG. 2 is a diagram illustrating a TFET architecture having an underlapped junction;

FIG. 3 is a diagram illustrating a starting structure for formation of a vertical gate-all-around (GAA) vertical TFET including a doped silicon germanium (SiGe) layer disposed on a silicon (Si) substrate, and a hardmask layer disposed on the doped SiGe layer according to an embodiment of the present invention;

DETAILED DESCRIPTION OF PREFERRED EMBODIMENTS

Figure 4:
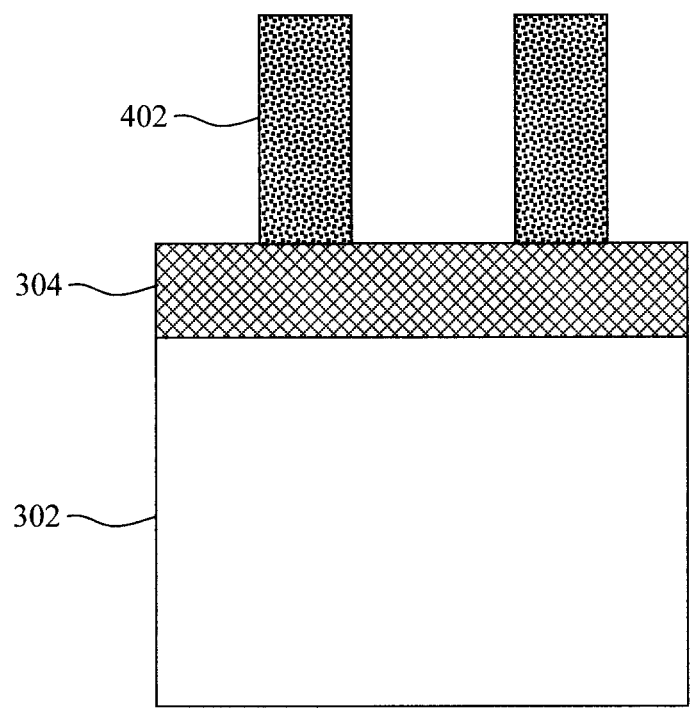
FIG. 4 is a diagram illustrating the hardmask layer having been patterned into individual fin hardmasks according to an embodiment of the present invention.

As provided above, a vertical gate-all-around (GAA) device architecture is an ideal configuration for a tunnel field effect transistor (TFET). However, a notable challenge in implementing TFET in a vertical gate-all-around architecture is that a self-aligned source side junction is needed for precise junction overlap control. See, for example, FIG. 1 which illustrates a TFET architecture having a self-aligned junction. As shown in FIG. 1, the gate is ideally aligned with the source-channel junction.

Without a self-aligned junction, the junction is then either underlapped or overlapped both of which are undesirable. Having an underlapped junction (see, for example, FIG. 2) is a serious concern since both turn-on abruptness and drive current will be degraded. Having an overlapped junction is less of a concern especially if the overlap is small. Nonetheless, an overlapped junction inevitably results in an undesirable increase in output capacitance (Ceff).

Advantageously, provided herein are techniques for integrating a (1) self-aligned (2) heterojunction for a TFET in a vertical gate-all-around device architecture. As will be described in detail below, the present techniques enable the integration of a high percentage germanium (Ge) source without defect generation, the formation of an abrupt (source-side) junction due to a low-temperature oxidation process, and require no additional masking or patterning steps (and are thereby fully compatible with the baseline vertical MOSFET process flow).

An exemplary embodiment of the present techniques is now described by way of reference to FIGS. 3-28 which illustrate an exemplary process for forming a vertical gate-all-around (or GAA) TFET. As shown in FIG. 3, the process begins with a doped silicon germanium (SiGe) layer 304 being formed on a silicon (Si) substrate 302.

Any suitable configuration can be employed for Si substrate 302. For instance, substrate 302 can simply be a bulk Si wafer. Alternatively, the substrate 302 can be a silicon-on-insulator (SOI) wafer with a SOI layer separated from an underlying (e.g., Si) substrate by a buried insulator. When the buried insulator is an oxide, it is also referred to as a buried oxide or BOX.

SiGe layer 304 is grown on the Si substrate 302 using an epitaxial process and thus is also referred to herein as an epitaxial layer. According to an exemplary embodiment, SiGe layer 304 is doped with a p-type dopant such as boron (B), i.e., SiGe layer 304 is B-doped SiGe or SiGeB. The doping of SiGe layer 304 can be carried out in-situ during growth of the layer, or ex-situ using, e.g., dopant implantation.

Preferably, SiGe layer 304 contains a high percentage of Ge. For example, according to an exemplary embodiment, SiGe layer 304 contains from about 20% Ge to about 30% Ge and ranges therebetween, e.g., SiGe layer 304 contains about 30% Ge.

Next, as shown in FIG. 3, a hardmask layer 306 is formed on the SiGe layer 304. Suitable hardmask materials include, but are not limited to, nitride hardmask materials such as silicon nitride (SiN). Standard lithography and etching techniques are then used to pattern the hardmask layer 306 into individual fin hardmasks 402. See FIG. 4. The hardmasks 402 mark the footprint and location of fins to be patterned in the Si substrate 302/SiGe layer 304.

Figure 5:
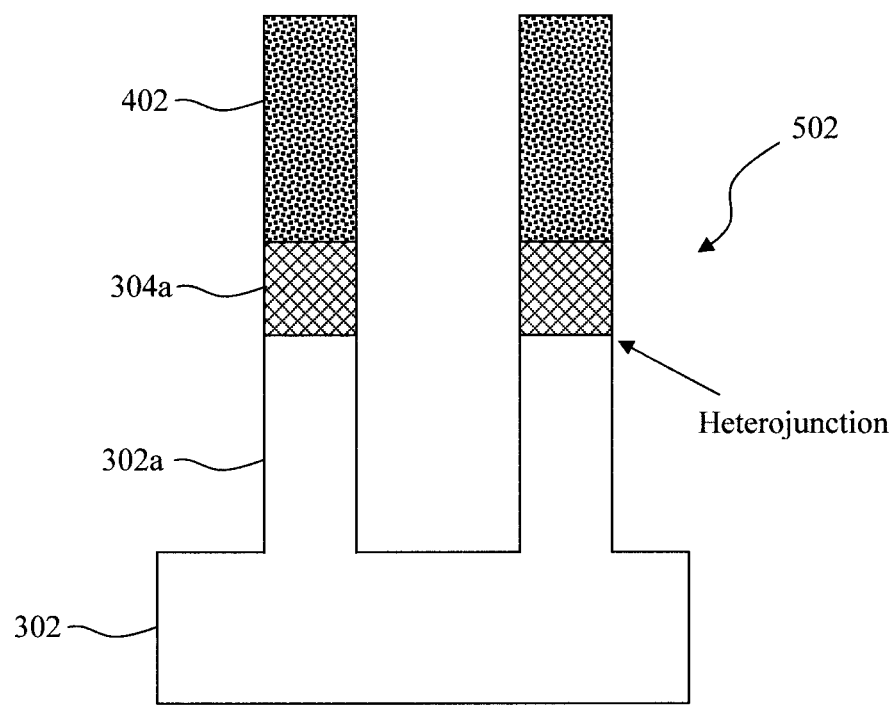
FIG. 5 is a diagram illustrating fins having been patterned in the SiGe layer and Si substrate using the fin hardmasks according to an embodiment of the present invention.
Figure 6:
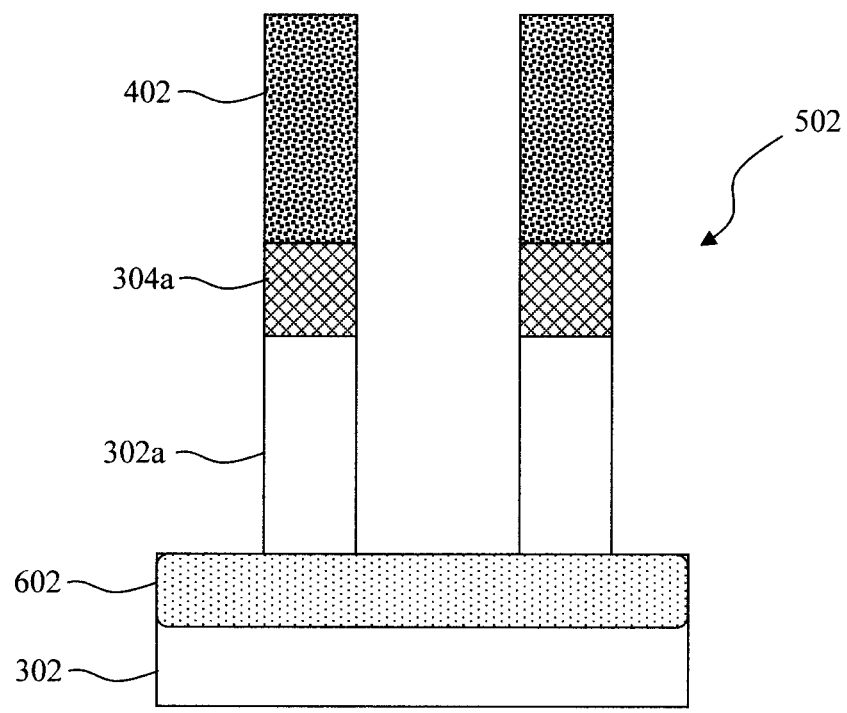
FIG. 6 is a diagram illustrating a bottom drain having been formed in the Si substrate beneath the fins according to an embodiment of the present invention.
Figure 7:
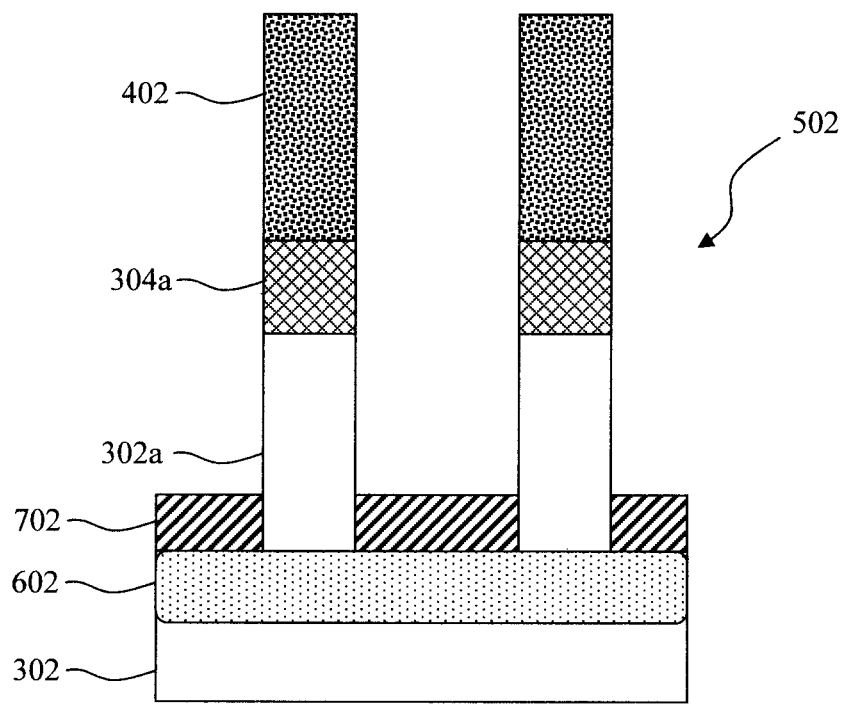
FIG. 7 is a diagram illustrating a bottom spacer having been formed on top of the bottom drain according to an embodiment of the present invention.
Figure 8:
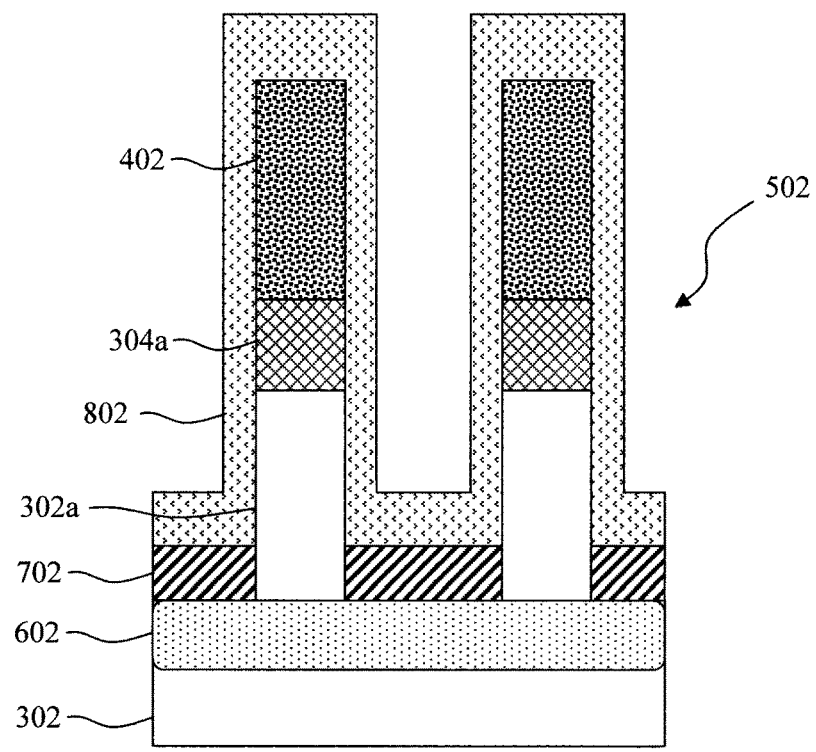
FIG. 8 is a diagram illustrating a conformal oxide layer (i.e., $GeO_2$) having been deposited over the fins according to an embodiment of the present invention.

Namely, as shown in FIG. 5 an etch is next performed to pattern fins 502 in the SiGe layer 304 and Si substrate 302 using the fin hardmasks 402. As shown in FIG. 5, the fin etch extends completely through the SiGe layer 304 and partway into the Si substrate 302. Thus, the fins 502 are formed from a portion 304a of the SiGe layer 304 and a portion 302a of the Si substrate 302. As will become apparent from the description that follows, the SiGe portion 304a of the fins will serve as the top source of the TFET device and the Si portion 302a will serve as the channel of the TFET device. The Si-to-SiGe junction between portion 302a and portion 304a will serve as the above-referenced heterojunction of the TFET device.

A bottom drain 602 is then formed in the Si substrate 302 beneath the fins 502. See FIG. 6. According to an exemplary embodiment, the bottom drain is doped with an n-type dopant, such as phosphorous (P), which is implanted into the Si substrate 302 under the fins 502 at this stage in the process.

A bottom spacer 702 is next formed on top of the bottom drain 602. See FIG. 7. The bottom spacer 702 serves to offset the bottom drain 602 from a gate stack of the TFET (that is to be formed as described below). Suitable materials for the bottom spacer 702 include, but are not limited to, oxide spacer materials such as silicon dioxide ($SiO_2$) and/or nitride spacer materials such as SiN.

According to an exemplary embodiment, the bottom spacer 702 is formed using a directional deposition process whereby the spacer material (e.g., $SiO_2$ and/or SiN) is deposited onto the bottom drain 602 with a greater amount of the material being deposited on the horizontal surfaces, as compared to the vertical surfaces. To use an illustrative example, a greater thickness of the spacer material will be deposited on top of the bottom drain 602 in between the fins 502 than along the sidewalls of the fins 502. Thus, when an etch is used on the spacer material, the timing of the etch needed to remove the spacer material from the vertical surfaces will leave the bottom spacer 702 shown in FIG. 7 on top of the bottom drain 602 since a greater amount of the spacer material was present on the bottom source/drain to begin with. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

Following formation of the fins 502 and bottom drain 602, the next phase in the process is to selectively form an oxide spacer (i.e., oxide spacer 902—see below) along only the sidewalls of the SiGe portion 304a of each of the fins 502. As will become apparent from the description that follows, this selective oxide spacer enables the top source-channel junction to be self-aligned with the gate.

To form this oxide spacer 902, a conformal oxide layer 802 is first deposited over the fins 502. See FIG. 8. As will be described in detail below, the present techniques leverage a low temperature oxidation process and selectivity for oxidation of the Si in SiGe due to a lower Gibbs free energy in the reaction to use the oxide layer 802 to selectively form the oxide spacer along only the sidewalls of the SiGe portion 304a of each of the fins 502 (and not on the Si portion 302a of each of the fins).

In general however, the process involves a Ge condensation reaction with a byproduct being the formation of silicon oxide. Thus, the conformal oxide layer 802 deposited onto the fins 502 contains Ge, e.g., conformal oxide layer 802 is germanium oxide ($GeO_2$).

Figure 9:
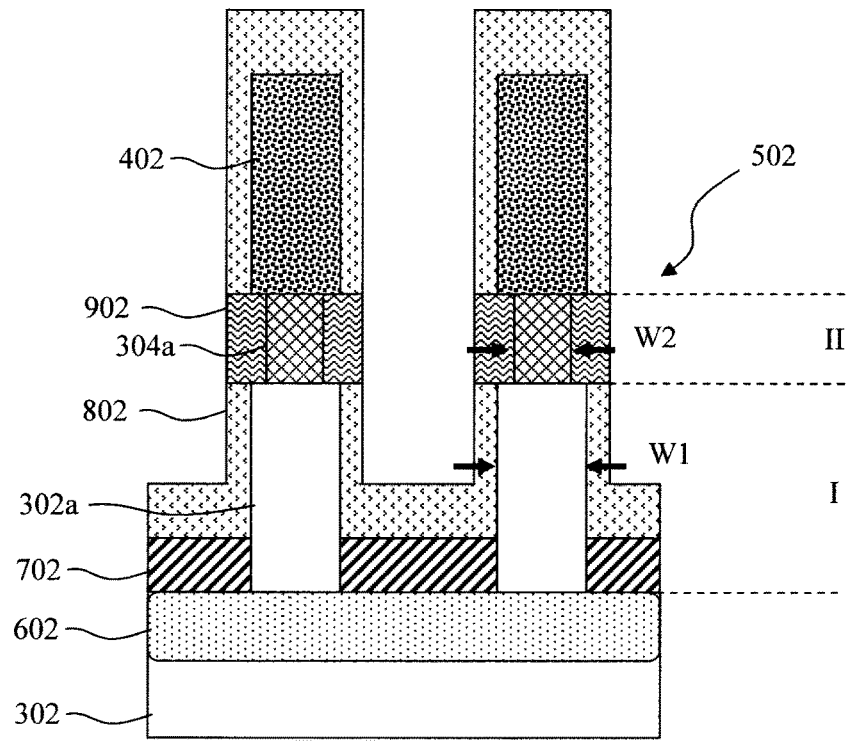
FIG. 9 is a diagram illustrating a low-temperature oxidation process having been used to selectively react the conformal oxide layer with only the underlying SiGe portion of each of the fins according to an embodiment of the present invention.

Next, as shown in FIG. 9 a low-temperature oxidation process is employed to selectively react the conformal oxide layer 802 (i.e., $GeO_2$) with only the underlying SiGe portion 304a of each of the fins 502. By way of example only, this low-temperature oxidation process involves annealing the conformal oxide layer 802 under conditions (e.g., temperature, duration, etc.) sufficient to form the oxide spacers 902 along only the sidewalls of the SiGe portion 304a of each of the fins 502. By way of example only, suitable conditions include a temperature of from about 500° C. to about 800° C. and ranges therebetween, and a duration of from about 1 second to about 30 seconds and ranges therebetween.

As shown in FIG. 9, this low-temperature oxidation process will produce oxide (e.g., $SiO_2$) spacers 902 along only the sidewalls of the SiGe portion 304a of each of the fins 502. The oxide spacers increase a width of the fins 502 at the SiGe portion 304a. See, for example, FIG. 9 where the fins 502 have a width W1 at a first region I thereof (which encompasses the Si portion 302a) and a width W2 at a second region II thereof (which encompasses the oxide spacers 902 and the SiGe portion 304a), wherein W1<W2. Width W1 is the original width of the fins 502 as patterned. Width W1 is configured to provide enough material in SiGe region 304a to form the spacers 902. However, as will be described in detail below, following formation of the spacers 902 the Si portion 302a (i.e., the vertical channel) of each of the fins 502 will be thinned to improve electrostatics of the device. See FIG. 18—described below.

As also shown in FIG. 9, the reaction forming the oxide spacers 902 consumes a portion of the (i.e., $GeO_2$) conformal oxide layer 802. Namely, there is no longer any of the conformal oxide layer 802 along the sidewalls of the SiGe portion 304a of each of the fins 502. Conversely, the conformal oxide layer 802 remains unreacted along other surfaces of the fins 502 (such as along the Si portion 302a of each of the fins 502). Those unreacted portions of the conformal oxide layer 802 will subsequently be removed. See below.

Figure 10:
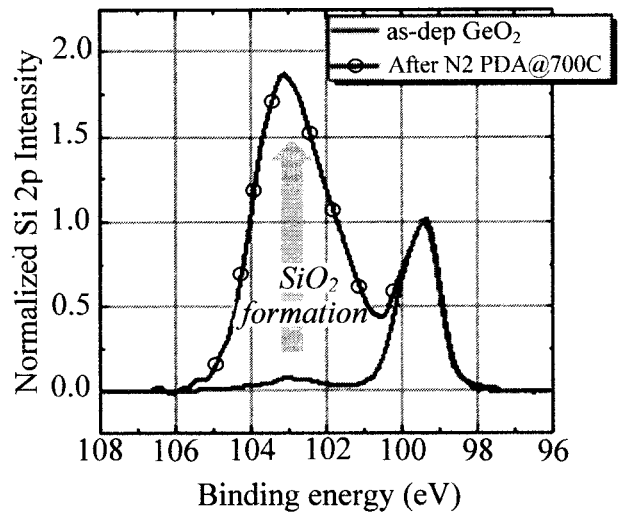
FIG. 10 is a diagram illustrating how the low-temperature oxidation process involves the formation of oxide ($SiO_2$) spacers according to an embodiment of the present invention.
Figure 11:
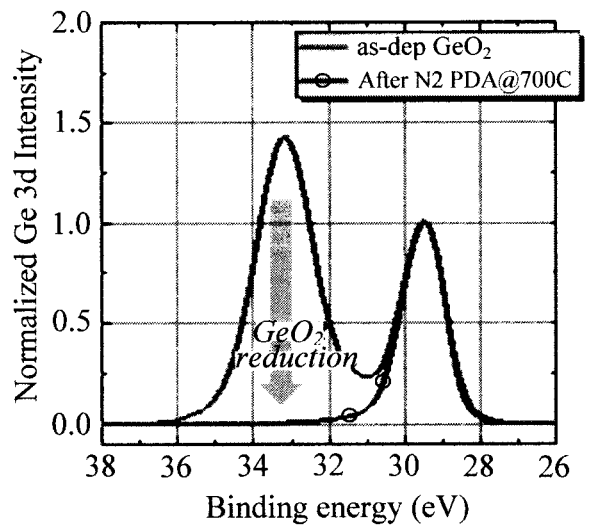
FIG. 11 is a diagram illustrating how the low-temperature oxidation process involves the consumption of $GeO_2$ from the conformal oxide layer according to an embodiment of the present invention.
Figure 12:
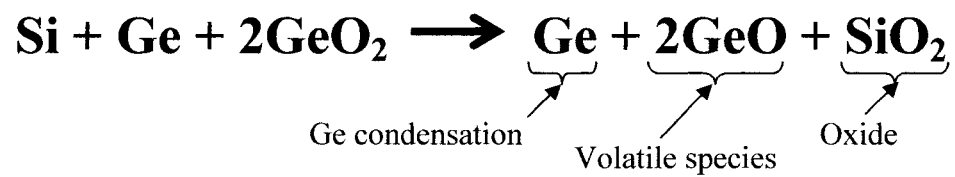
FIG. 12 is a diagram illustrating the reaction taking place to form the oxide spacers according to an embodiment of the present invention.
Figure 13:
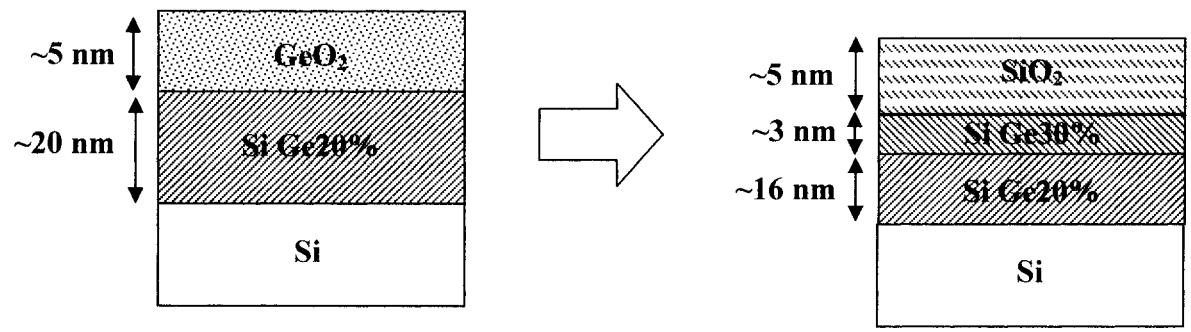
FIG. 13 is a diagram illustrating how the reaction involves Ge condensation and the formation of a layer of $SiO_2$ (which is the content of oxide spacer) according to an embodiment of the present invention.

FIGS. 10-12 illustrate the reaction used to selectively form the oxide spacers 902 on the SiGe portion 304a of the fins 502. As provided above, the reaction includes the formation of $SiO_2$ (see FIG. 10) and the consumption of $GeO_2$ (see FIG. 11). In this example, the post deposition anneal (PDA) was carried out at a temperature of 700° C. in a nitrogen ($N_2$) ambient. FIG. 12 shows the reaction that is taking place. Specifically, with SiGe and $GeO_2$ as reactants, the products are condensed Ge and $SiO_2$ (along with a volatile byproduct). For instance, as depicted in FIG. 13 Ge will condense to form a higher Ge percentage layer of SiGe (see SiGe layer with 30% Ge having been formed on the SiGe layer with 20% Ge) and a layer of $SiO_2$ (which is the content of oxide spacer 902). Notably, oxidation of the Si substrate does not occur.

Following formation of oxide spacers 902, the unreacted portions of the conformal oxide layer 802 are removed. See FIG. 14. Since the above-described reaction to form oxide spacers 902 involves Ge condensation, the reaction process can (optionally) be iterated multiple times to increase the percentage of Ge in the SiGe portion 304a which, as provided above, will serve as the top source of the TFET device. With each iteration, the percentage of Ge in the SiGe portion 304a will increase incrementally. Increasing the Ge percentage increases the tunneling probability, thereby increasing the drive current. In general, the higher the Ge percentage percent the better. But since this process will also shrink the width of the SiGe portion 304a, the limit will be that the width of the SiGe portion 304a cannot be less than W3 in FIG. 18 (described below).

Figure 14:
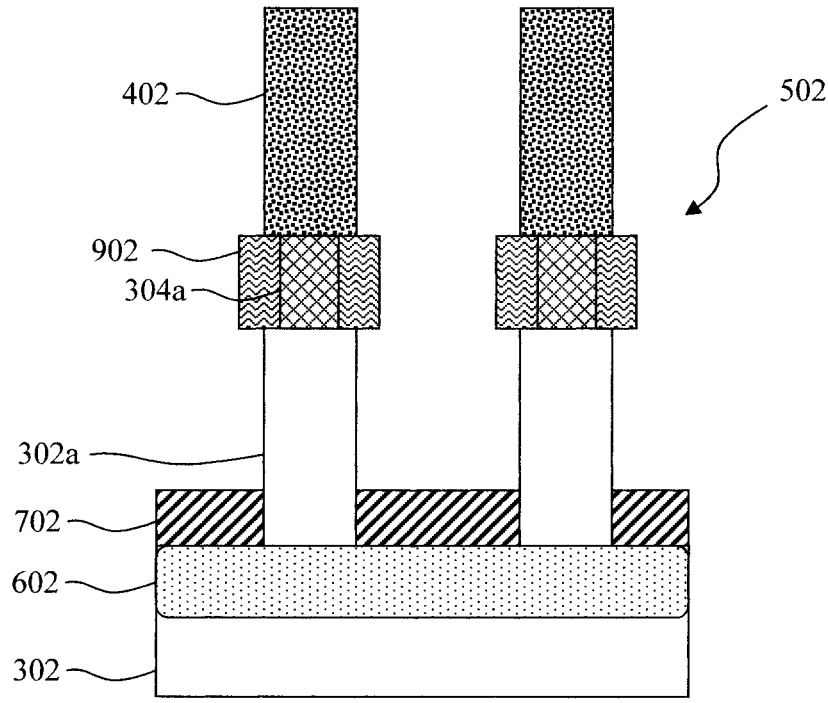
FIG. 14 is a diagram illustrating unreacted portions of the conformal oxide layer having been removed after formation of oxide spacers according to an embodiment of the present invention.
Figure 15:
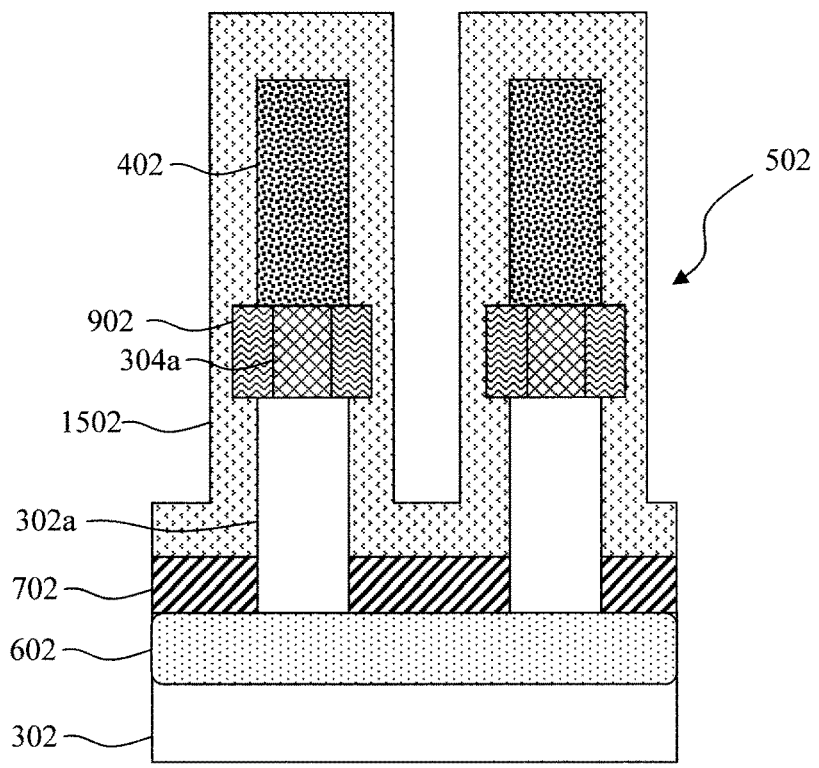
FIG. 15 is a diagram illustrating an additional layer of the conformal oxide (i.e., $GeO_2$) having been deposited onto the fins over the oxide spacers according to an embodiment of the present invention.
Figure 16:
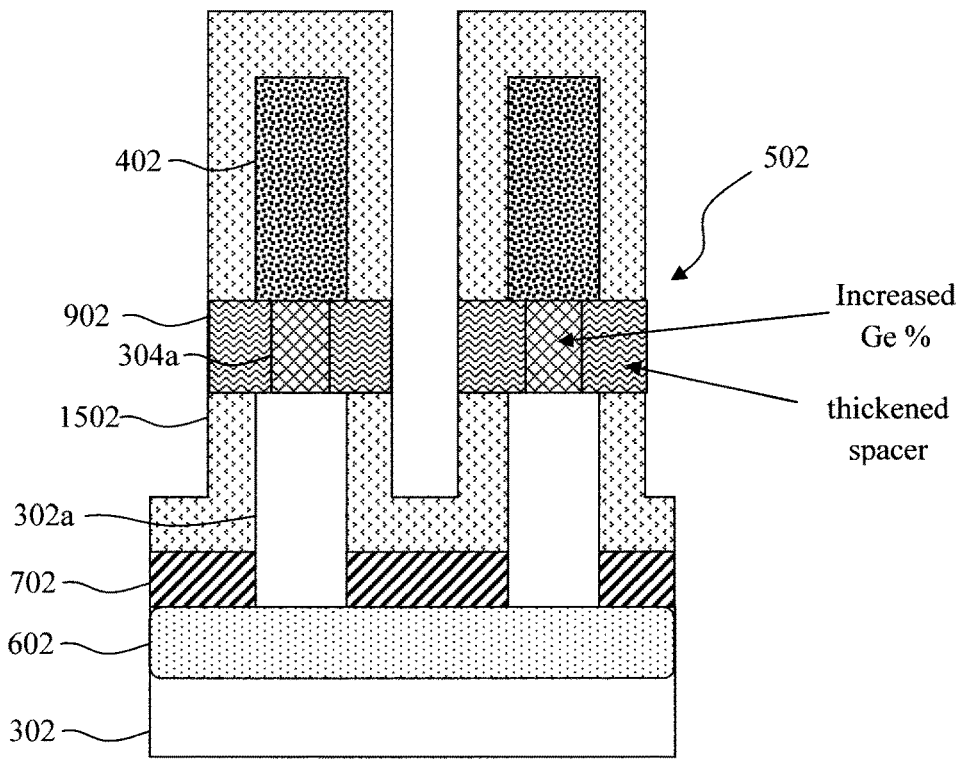
FIG. 16 is a diagram illustrating another low-temperature anneal being used to thicken the oxide spacers and increases the percentage of Ge in the SiGe portion according to an embodiment of the present invention.
Figure 17:
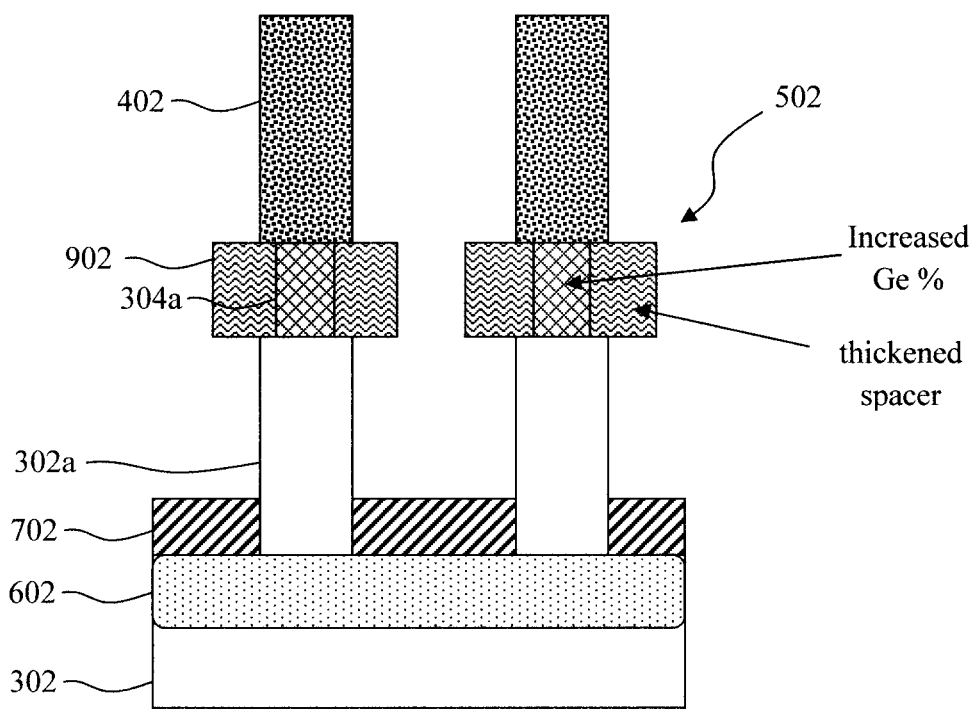
FIG. 17 is a diagram illustrating unreacted portions of the additional layer of the conformal oxide layer having been removed according to an embodiment of the present invention.
Figure 18:
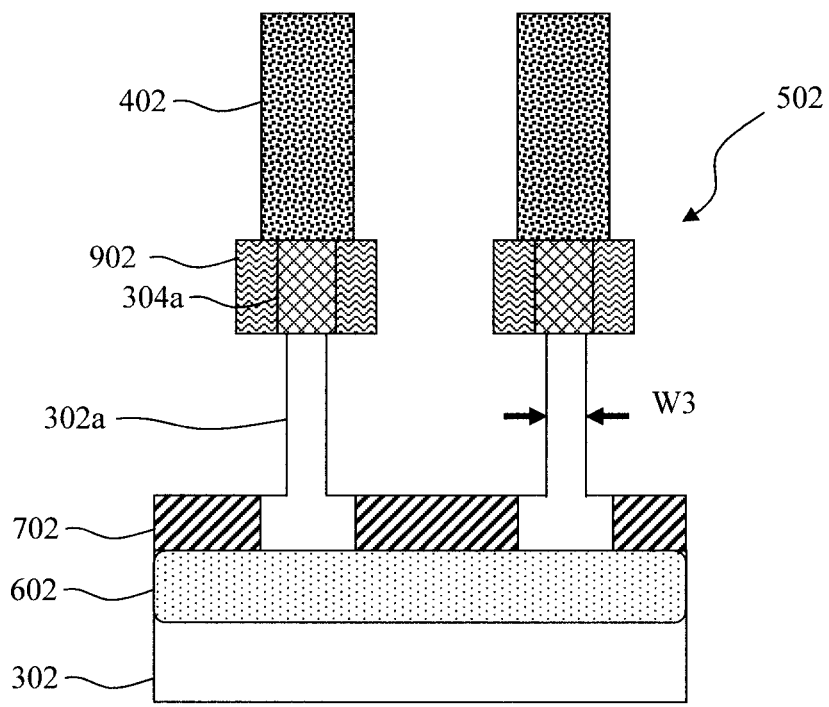
FIG. 18 is a diagram illustrating the Si portion of the fin having been trimmed according to an embodiment of the present invention.
Figure 19:
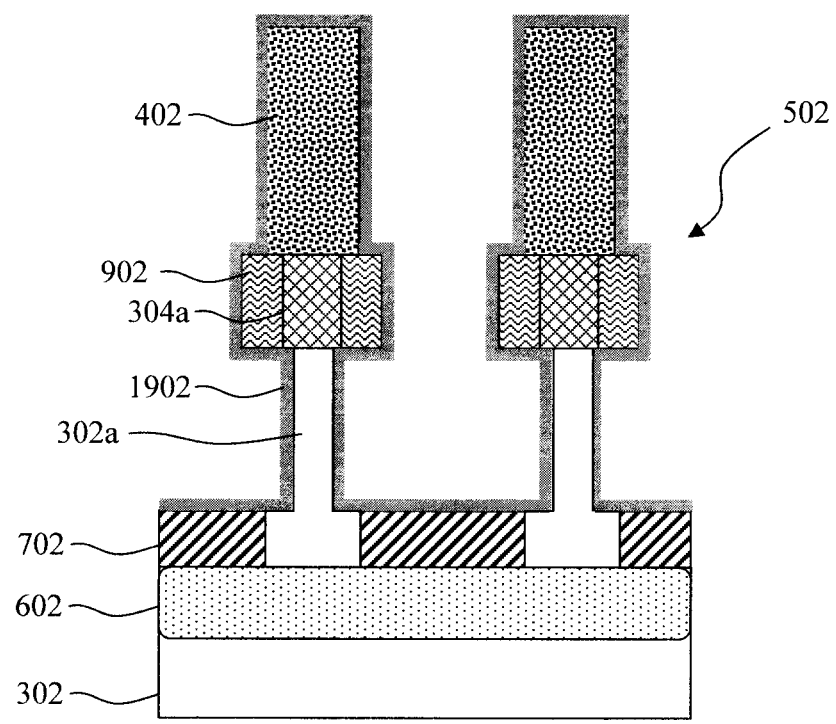
FIG. 19 is a diagram illustrating a conformal gate dielectric having been deposited onto each of the fins according to an embodiment of the present invention.
Figure 20:
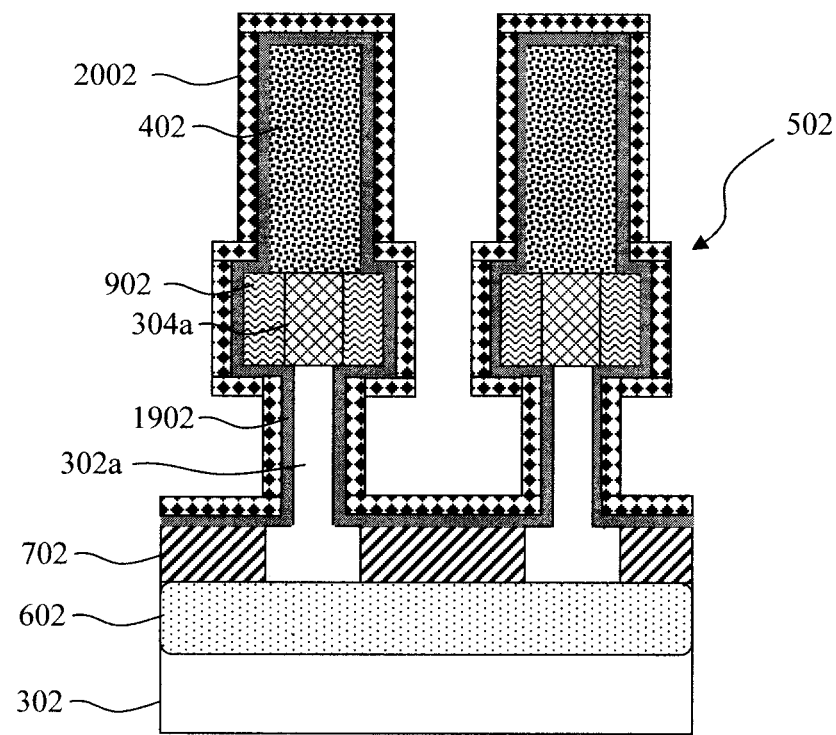
FIG. 20 is a diagram illustrating a conformal workfunction-setting metal having been deposited onto the gate dielectric according to an embodiment of the present invention.

One such iteration is illustrated in FIGS. 15-17. As shown in FIG. 15, an additional layer 1502 of the conformal oxide (i.e., $GeO_2$) is deposited onto the fins 502 over the oxide spacers 902. The above-described low-temperature anneal is then used to drive the reaction which, as shown in FIG. 16, thickens the ($SiO_2$) spacers 902 and increases the percentage of Ge in the SiGe portion 304a (i.e., the top source of the TFET device). Following the reaction, the unreacted portions of conformal oxide layer 1502 are removed. See FIG. 17. Advantageously, this process increases the Ge percentage in the source without generating defects. Namely, unlike a conventional epitaxial growth, this is based on the chemical reaction of SiGe and $GeO_2$. The exchange of Si (from the SiGe surface) and Ge atoms (from $GeO_2$) at the low temperature helps to avoid the defect generation. The process illustrated in FIGS. 9-17 can be repeated x number of times until a desired Ge percentage (e.g., is from about 30% to about 99% and ranges therebetween) is achieved.

For ease and clarity of depiction, description of the process flow will proceed from the structure shown in FIG. 14 with the understanding that multiple iterations may be performed in accordance with the description of FIGS. 15-17, if so desired, to increase the thickness of spacers 902 and to increase the Ge percentage.

A trimming of the Si portion 302a of the fin (i.e., the vertical fin channel) is next performed. See FIG. 18. A fin trim is performed to maintain electrostatics of the device. Specifically, if the vertical fin channel is too wide, there is a chance for current leakage. However, initially the fins 502 need to be patterned with a sufficient width (W1—see FIG. 9—described above) to enable formation of the spacers 902. If the fins 502 are initially patterned with a width W1 that is too narrow, then there is a risk that all of the SiGe in portion 304a will be consumed during the reaction to form spacers 902 and the Si/SiGe heterojunction between portion 302a and portion 304a will undesirably be lost. According to an exemplary embodiment, the as-patterned fin width W1 (and thus the initial width of the Si portion 302a) is from about 10 nanometers (nm) to about 20 nm and ranges therebetween, the width W2 after formation of the spacers 902 (see FIG. 9) is from about 8 nm to about 18 nm and ranges therebetween, and a width W3 of the Si portion 302a (i.e., the vertical fin channel) of the fins 502 after thinning (see FIG. 18) is from about 5 nm to about 10 nm and ranges therebetween.

Trimming of the vertical fin channel can be carried out using chemical oxidation or any process selective for etching Si. By way of example only, the Si portion 302a of the fins 502 can first be exposed to a chemical oxidant (such as wet oxidation) to form a silicon oxide (SiO) along the sidewalls thereof, and reducing the width of the vertical fin channel in the process. A selective etch is then used to remove the SiO from the trimmed vertical fin channel. The process (oxidation and oxide etch) can be repeated multiple times, if so desired, until a fin channel of a desired width (see above) is achieved.

A gate stack is next formed surrounding the portion 302a (i.e., the vertical fin channel) of the fins 502. As highlighted above, a vertical architecture enables the gate stack to surround the channel in a gate-all-around (or GAA) configuration. Specifically, the gate stack will fully surround at least a portion of the vertical fin channel.

To begin formation of the gate stack, a conformal gate dielectric 1902 is first deposited onto each of the fins 502. See FIG. 19. According to an exemplary embodiment, the gate stack will include a metal or combination of metals as the gate conductor (see below). Suitable gate dielectrics for a metal gate include, but are not limited to, high-κ materials such as hafnium oxide ($HfO_2$) and/or lanthanum oxide ($La_2O_3$). The term "high-κ" as used herein refers to a material having a relative dielectric constant κ which is much higher than that of silicon dioxide (e.g., a dielectric constant κ=25 for $HfO_2$ rather than 4 for silicon dioxide).

Next, a conformal workfunction-setting metal layer 2002 is deposited onto the gate dielectric 1902. See FIG. 20. The particular workfunction-setting metal employed can vary depending on whether an n-type or p-type device is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above.

Figure 21:
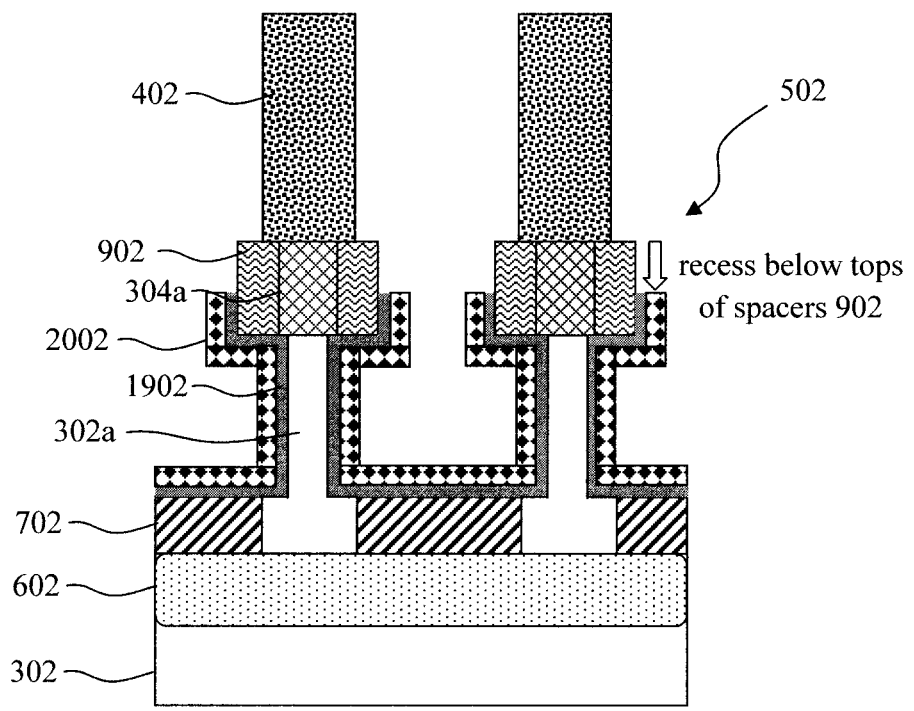
FIG. 21 is a diagram illustrating the gate dielectric and workfunction-setting metal layer having been recessed according to an embodiment of the present invention.
Figure 22:
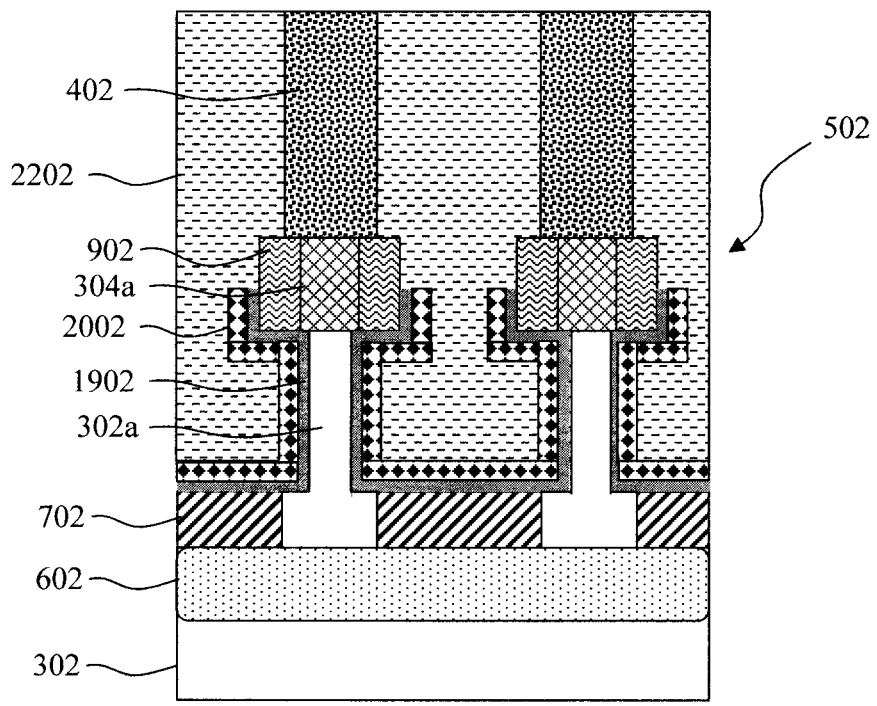
FIG. 22 is a diagram illustrating a low resistance gate metal having been blanket deposited onto the workfunction-setting metal layer and burying the fins/filling spaces between the fins according to an embodiment of the present invention.

Next the gate dielectric 1902 and workfunction-setting metal layer 2002 are recessed. See FIG. 21. As shown in FIG. 21, the gate dielectric 1902 and workfunction-setting metal layer 2002 are preferably recessed to be below a top surface of the spacers 902 (but above a bottom surface of the spacers 902 since the spacers 902 are intended to offset the gate stack from the top source). A low resistance gate metal (i.e., a filler gate metal) 2202 is then blanket deposited onto the workfunction-setting metal layer 2002 and burying the fins 502/filling spaces between the fins 502. See FIG. 22. Suitable low resistance gate metals include, but are not limited to tungsten (W) and/or aluminum (Al).

Figure 23:
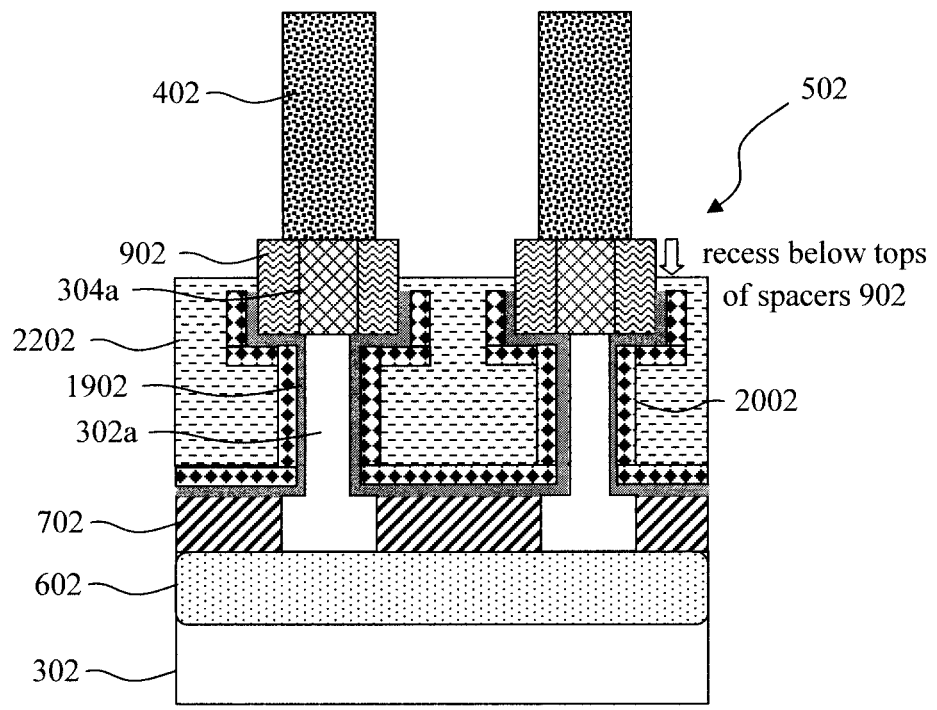
FIG. 23 is a diagram illustrating the low resistance gate metal having been recessed according to an embodiment of the present invention.
Figure 24:
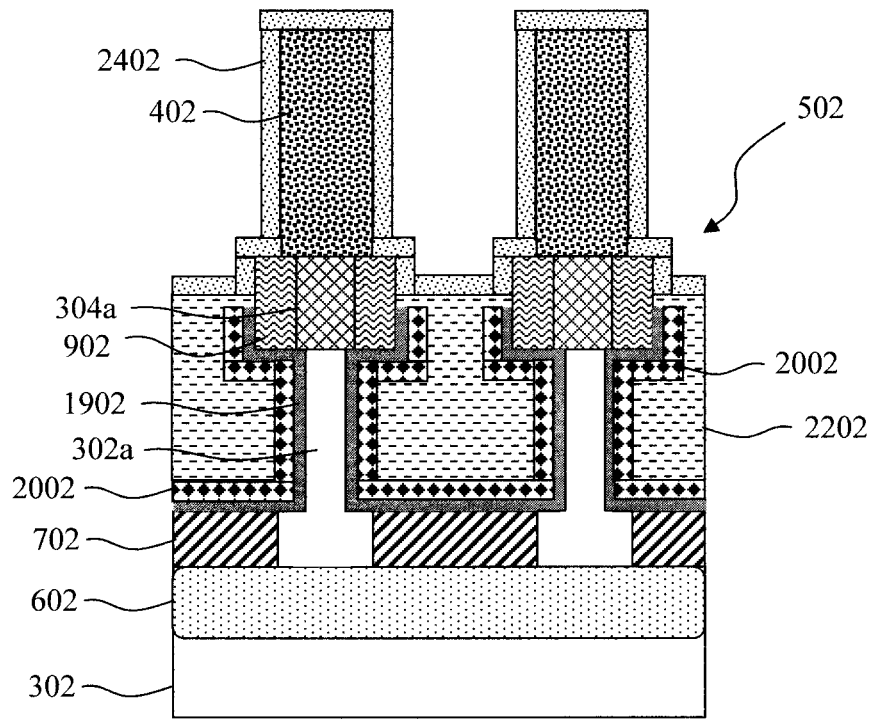
FIG. 24 is a diagram illustrating a conformal encapsulation layer having been formed over the exposed tops of the fins according to an embodiment of the present invention.
Figure 25:
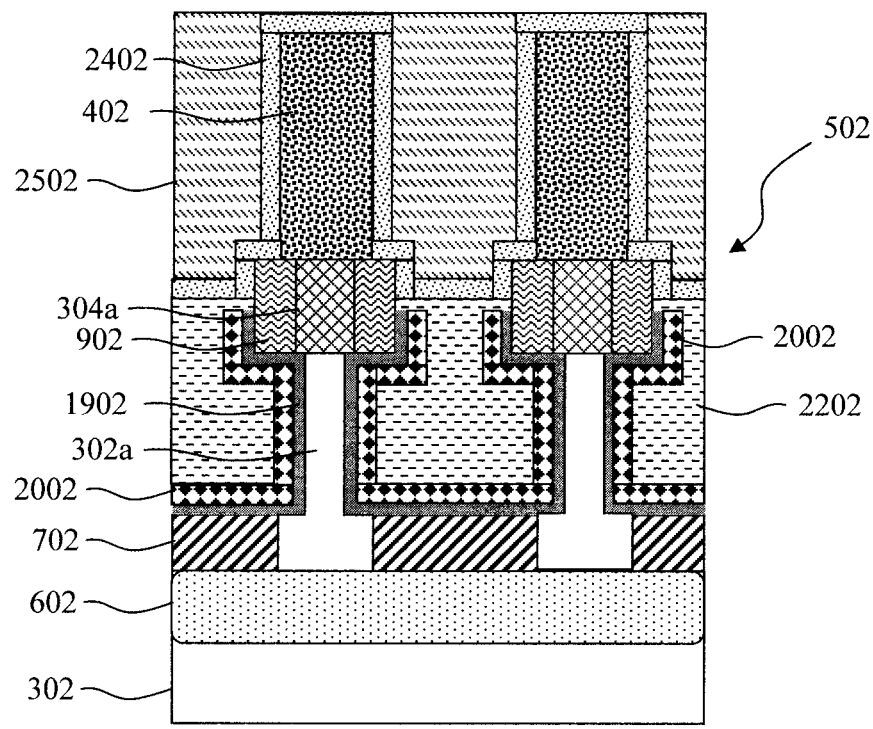
FIG. 25 is a diagram illustrating an interlayer dielectric having been blanket deposited onto the encapsulation layer over the tops of the fins, filling in spaces between the tops of the fins according to an embodiment of the present invention.
Figure 26:
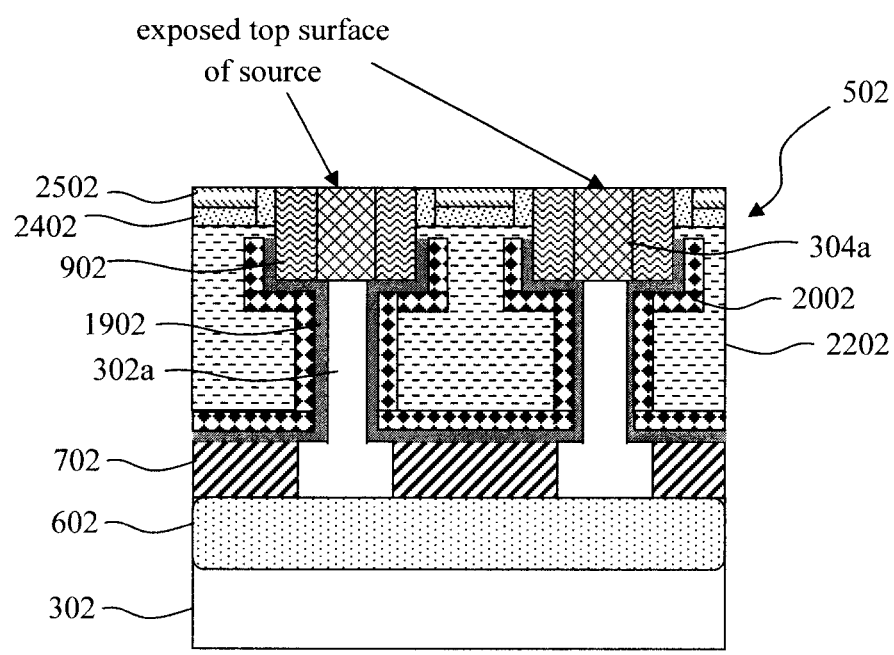
FIG. 26 is a diagram illustrating a planarization process having been used to expose a top surface of the SiGe portions of the fins by removing the hardmasks, the encapsulation layer and the interlayer dielectric from over the fins according to an embodiment of the present invention.

In order to access the SiGe portions 304a of the fins 502 (i.e., the top source of the TFET), the low resistance gate metal 2202 is recessed using, e.g., a metal-selective chemical-mechanical polishing (CMP) process. See FIG. 23. As shown in FIG. 23, the low resistance gate metal 2202 is preferably recessed to be below a top surface of the spacers 902 (e.g., level with the recessed gate dielectric 1902 and workfunction-setting metal layer 2002). Recessing the low resistance gate metal 2202 exposes the tops of the fins 502.

A conformal encapsulation layer 2402 is then formed over the now-exposed tops of the fins 502. See FIG. 24. According to an exemplary embodiment, the encapsulation layer 2402 is formed from a nitride material such as SiN. An interlayer dielectric (ILD) 2502 is blanket deposited onto the encapsulation layer 2402 over the tops of the fins 502, filling in spaces between the tops of the fins 502. See FIG. 25.

Figure 27:
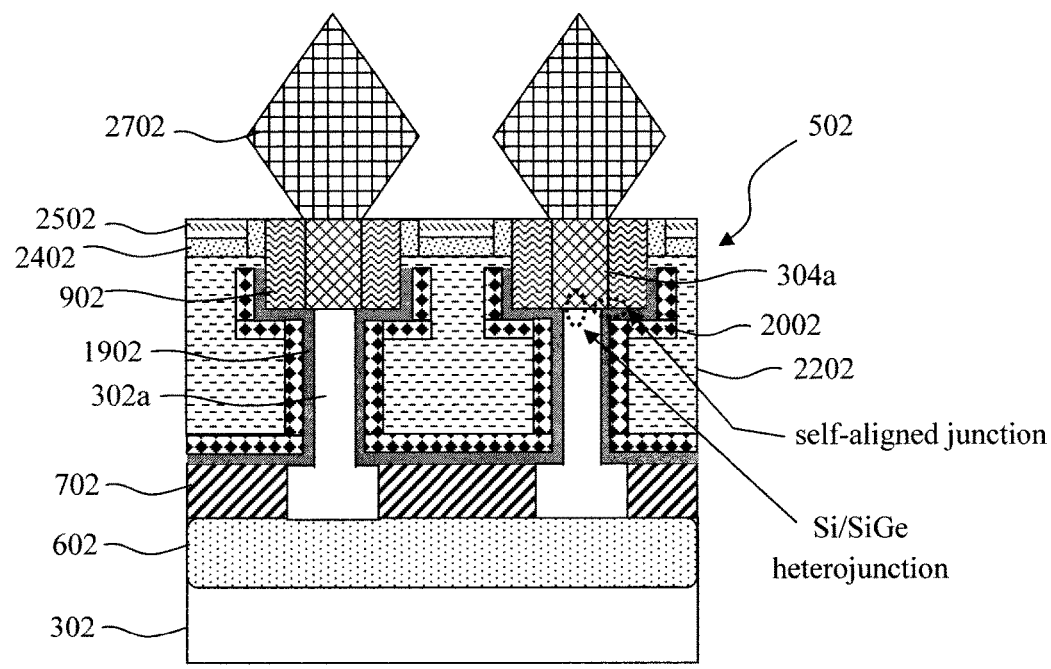
FIG. 27 is a diagram illustrating contacts having been formed to the top source according to an embodiment of the present invention.
Figure 28:
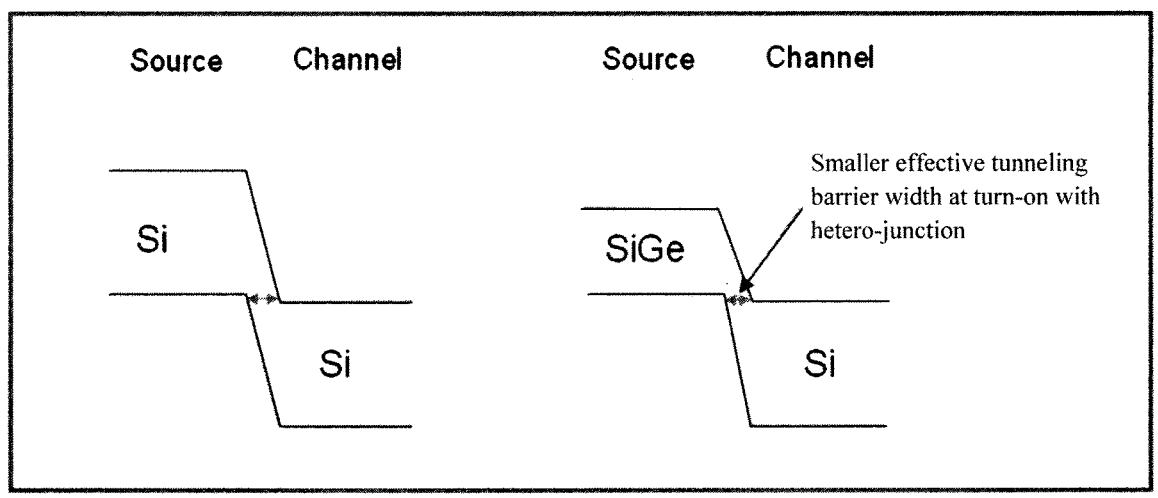
FIG. 28 is a diagram illustrating that there is a smaller effective tunneling barrier width at turn-on with a (Si/SiGe) heterojunction between the channel and source as compared to a junction between homogenous materials according to an embodiment of the present invention.

A planarization process such as CMP is then used to expose a top surface of the SiGe portions 304a of the fins 502 (i.e., the top source of the TFET) by removing the hardmasks 402, the encapsulation layer 2402 and the ILD 2502 from over the fins 502. See FIG. 26. This enables the formation of contacts 2702 to the top source. See FIG. 27. According to an exemplary embodiment, an epitaxial growth process is used to form the contacts 2702 whereby the growth is templated off of the exposed top surface of the SiGe portions 304a of the fins 502. Thus growth of the epitaxial material for contacts 2702 will be selective to the tops of the fins 502 as shown in FIG. 27. By way of example only, the contacts 2702 can be formed from the same material (e.g., SiGeB) as the SiGe portions 304a of the fins 502. Doping of the contacts 2702 can be carried out in-situ during epitaxy, or ex-situ using, e.g., dopant implantation.

As shown in FIG. 27, by way of the present process a Si/SiGe heterojunction is formed at the top source between the Si portion 302a and the SiGe portion 304a of the fins 502. Further, by way of the precise, selective placement of the oxide spacers 902 alongside only the (source) SiGe portion 304a of the fins 502, the gate stack at the source side of the fins 502 is perfectly aligned with this heterojunction (i.e., the gate stack neither over-nor under-laps the junction). Furthermore, this is a self-aligning process since the oxide spacers 902 align precisely with the heterojunction, and thus forming the gate stack over the spacers 902 will self-align the gate stack with the junction.

With a (Si/SiGe) heterojunction between the channel and source there is a smaller effective tunneling barrier width at turn-on as compared to a junction between homogenous materials. See FIG. 28. On the left side of FIG. 28 an example is provided of a TFET Si/Si channel-source junction (for comparison) and on the right side is a TFET Si/SiGe channel-source heterojunction as according to the present techniques.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical tunnel field effect transistor (TFET) device, the method comprising the steps of:
   forming a doped silicon germanium (SiGe) layer on, and in direct contact with, a silicon (Si) substrate;
   patterning the doped SiGe layer and the Si substrate to form fins that extend through the doped SiGe layer and partway into the Si substrate such that each of the fins includes a doped SiGe portion disposed directly on a Si portion with a heterojunction therebetween, wherein the SiGe portion is a source and the Si portion is a channel;
   forming a drain in the Si substrate beneath the fins;
   forming a bottom spacer on the drain;
   selectively forming oxide spacers, aligned with the heterojunction, along and in direct contact with opposite sidewalls of only the doped SiGe portion of each of the fins, wherein the oxide spacers fully cover the opposite sidewalls of the doped SiGe portion of each of the fins down to the heterojunction; and
   forming a gate stack around the Si portion and doped SiGe portion of each of the fins, wherein the gate stack is offset from the source by the oxide spacers while, below the oxide spacers, the gate stack is in contact with the channel such that the gate stack is aligned with the heterojunction.

2. The method of claim 1, wherein the doped SiGe layer is doped with a p-type dopant.

3. The method of claim 2, wherein the doped SiGe layer comprises boron (B)-doped SiGe (SiGeB).

4. The method of claim 1, wherein the gate stack fully surrounds the channel in a gate-all-around configuration.

5. The method of claim 1, wherein the doped SiGe layer formed on the Si substrate comprises from about 20% Ge to about 30% Ge and ranges therebetween.

6. The method of claim 1, wherein the oxide spacers comprise silicon dioxide ($SiO_2$).

7. The method of claim 6, wherein the step of selectively forming the oxide spacers along opposite sidewalls of only the doped SiGe portion of each of the fins comprises the steps of:
   depositing a conformal oxide layer over the fins, wherein the conformal oxide layer comprises germanium oxide ($GeO_2$);
   annealing the conformal oxide layer under conditions sufficient to form the oxide spacers along opposite sidewalls of only the doped SiGe portion of each of the fins; and
   removing unreacted portions of the conformal oxide layer from the fins.

8. The method of claim 7, wherein the conditions comprise a temperature and a duration.

9. The method of claim 8, wherein the temperature is from about 500° C. to about 800° C. and ranges therebetween.

10. The method of claim 8, wherein the duration is from about 1 second to about 30 seconds and ranges therebetween.

11. The method of claim 7, wherein the annealing increases a percentage of Ge in the SiGe portion of each of the fins, the method further comprising the step of:
   repeating the depositing, annealing and removing steps multiple times to further increase the percentage of Ge in the SiGe portion of each of the fins.

12. The method of claim 11, wherein, after performing the repeating step, the percentage of Ge in the SiGe portion of each of the fins is from about 30% to about 99% and ranges therebetween.

13. The method of claim 1, further comprising the step of:
   trimming the Si portion of each of the fins below the oxide spacers and above the bottom spacers to reduce a width of the Si portion of each of the fins below the oxide spacers and above the bottom spacers.

14. The method of claim 13, wherein an initial width of the Si portion of each of the fins is from about 10 nm to about 20 nm and ranges therebetween, and wherein the width of the Si portion of each of the fins below the oxide spacers and above the bottom spacers after the trimming step has been performed is from about 5 nm to about 10 nm and ranges therebetween.

15. The method of claim 1, wherein the step of forming the gate stack comprises the steps of:
   depositing a conformal gate dielectric around the Si portion and doped SiGe portion of each of the fins, wherein the conformal gate dielectric is offset from the source by the oxide spacers;
   depositing a conformal workfunction-setting metal layer onto the conformal gate dielectric;
   recessing the conformal gate dielectric and the conformal workfunction-setting metal layer to below a top surface of the oxide spacers;
   depositing a low resistance gate metal onto the conformal workfunction-setting metal layer and burying the fins; and
   recessing the low resistance gate metal to below the top surface of the oxide spacers.

16. The method of claim 15, wherein the conformal gate dielectric comprises a high-κ gate dielectric selected from the group consisting of: hafnium oxide ($HfO_2$), lanthanum oxide ($La_2O_3$), and combinations thereof.

17. The method of claim 15, wherein the conformal workfunction-setting metal layer is selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W) and combinations thereof.

18. The method of claim 1, further comprising the step of:
   forming epitaxial contacts to the source, wherein the contacts are formed from a same material as the doped SiGe portion of each of the fins.

\* \* \* \* \*